(12) United States Patent
Takahashi

(10) Patent No.: US 6,258,708 B1
(45) Date of Patent: *Jul. 10, 2001

(54) METHOD OF FABRICATING GATE CONTACT PODS, LOAD LINES AND WIRING STRUCTURES USING A MINIMUM NUMBER OF ETCHING STEPS

(75) Inventor: Toshifumi Takahashi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,768

(22) Filed: Mar. 16, 1998

(30) Foreign Application Priority Data

Mar. 14, 1997 (JP) .................................................. 9-060752

(51) Int. Cl.[7] .............................................. H01L 21/4763

(52) U.S. Cl. .......................... 438/620; 438/657; 438/637

(58) Field of Search ..................................... 438/620, 657

(56) References Cited

U.S. PATENT DOCUMENTS

| | | | |
|---|---|---|---|
| 4,753,709 | * 6/1988 | Welch et al. ......................... | 156/306 |
| 4,996,167 | * 2/1991 | Chen .................................... | 438/279 |
| 5,010,039 | * 4/1991 | Ku et al. .............................. | 438/702 |

(List continued on next page.)

FOREIGN PATENT DOCUMENTS

| | | |
|---|---|---|
| 3-147364 | 6/1991 | (JP) . |
| 4-179269 | 6/1992 | (JP) . |
| 6-163535 | 6/1994 | (JP) . |

OTHER PUBLICATIONS

Horiba, S. et al., "A Symmetric Diagonal Driver Transistor SRAM Cell with Imbalance Suppression Technology for Stable Low Voltage Operation", 1996 Symposium on VLSI Technology Digest of Technical Papers, ULSI Device Development Laboratories, NEC Corporation, Kanagawa, Japan, pp. 144–145.

*Primary Examiner*—Olik Chaudhuri
*Assistant Examiner*—Shrinivas H. Rao
(74) *Attorney, Agent, or Firm*—Hutchins, Wheeler & Dittmar

(57) ABSTRACT

There is provided a method of fabricating a semiconductor device, including the steps of forming a silicon oxide film on a semiconductor substrate for defining device isolation regions therewith, forming a gate oxide film over the product resulting from the previous step, forming an electrically conductive film over the product resulting from the previous step, forming a first insulating film over the electrically conductive film, etching the first insulating film and the electrically conductive film to thereby form a first wiring layer comprising a plurality of sections, forming a second insulating film around a sidewall of the sections of the first wiring layer, forming a first interlayer insulating film over the product resulting from the previous step, simultaneously forming a first contact hole reaching the semiconductor substrate and a second contact hole reaching the first wiring layer, forming a second wiring layer over the product resulting from the previous step, forming a second interlayer insulating film over the product resulting from the previous step, simultaneously forming a third contact hole reaching the semiconductor substrate and a fourth contact hole reaching the second wiring layer, forming a contact plug in each of the third and fourth contact holes, and forming a third wiring layer on the second interlayer insulating film so as to make contact with the contact plug. The above-mentioned method reduces the number of masks to be used for fabricating a semiconductor device, ensuring the enhancement of productivity, and presents the greater designability of forming a contact hole above a gate.

22 Claims, 6 Drawing Sheets

U.S. PATENT DOCUMENTS

| | | | |
|---|---|---|---|
| 5,084,416 | * | 1/1992 | Ozaki et al. .......................... 438/197 |
| 5,108,941 | * | 4/1992 | Paterson et al. ..................... 438/396 |
| 5,409,855 | * | 4/1995 | Jun ....................................... 438/253 |
| 5,563,088 | * | 10/1996 | Tseng .................................. 438/253 |
| 5,707,883 | * | 1/1998 | Tabara .................................. 438/297 |
| 5,792,703 | * | 8/1998 | Bronner et al. ...................... 438/620 |
| 5,885,889 | * | 3/1999 | Aisou ................................... 438/592 |
| 5,943,598 | * | 8/1999 | Lin ....................................... 438/618 |

* cited by examiner

METHOD OF FABRICATING GATE CONTACT PODS, LOAD LINES AND WIRING STRUCTURES USING A MINIMUM NUMBER OF ETCHING STEPS

BACKGROUND OF THE INVENTION

Field of the Invention

The invention relates to a semiconductor device and a method of fabricating the same, and more particularly to a semiconductor device having a multi-layered wiring structure and a method of fabricating the same.

Description of the Related Art

FIGS. 1A to 1F are cross-sectional views of a semiconductor device, illustrating respective steps of a conventional method of fabricating a semiconductor device such as SRAM.

As illustrated in FIG. 1A, a silicon dioxide film 2 is formed on a semiconductor substrate 1 by a thickness in the range of 200 nm to 500 nm. The silicon dioxide film 2 defines device formation regions surrounded therewith where a semiconductor device is to be formed. Then, a silicon dioxide film as a gate oxide film 3 is formed on the semiconductor substrate 1 in the device formation regions by a thickness in the range of 4 nm to 10 nm. Then, a polysilicon film and a refractive silicide film are deposited over the product by a total thickness in the range of 50 nm to 300 nm. This multi-layered structure will make a gate electrode or a first wiring layer. Then, a silicon nitride film 5 is deposited over the multi-layered structure by a thickness in the range of 50 nm to 200 nm.

A patterned photoresist (not illustrated) is formed on the silicon nitride film 5, and then, the silicon nitride film 5 is etched by using the patterned photoresist as a mask. Subsequently, the multi-layered structure of the polysilicon film and the refractive silicide film is etched to thereby form a gate electrode layer 4. Then, a sidewall 6 made of silicon nitride is formed around both the silicon nitride film 5 and the gate electrode layer 4. Then, a first interlayer insulating film 7 is deposited entirely over the product. FIG. 1A illustrates the thus formed intermediate product.

Then, as illustrated in FIG. 1B, a patterned photoresist 10B is formed on the first interlayer insulating film 7, followed by anisotropic etching to thereby form a shared contact hole 8. The thus formed shared contact hole 8 reaches both the gate electrode layer 4 and the semiconductor substrate 1.

After removal of the photoresist 10B, a polysilicon or SIPOS film 11 as a second wiring layer is deposited over the product by a thickness in the range of 20 nm to 100 nm. SIPOS is an abbreviation of "semi-insulating polycrystalline silicon", and means a mixture of $SiH_4$ and $N_2O$ usually synthesized by chemical vapor deposition (CVD). SIPOS is usually used for forming a highly resistive load element. After the formation of the polysilicon or SIPOS film 11, a patterned photoresist 12B is formed on the polysilicon or SIPOS film 11, as illustrated in FIG. 1C.

Then, the polysilicon or SIPOS film 11 is anisotropically etched with the patterned photoresist 12B acting as a mask, to thereby form a resistive layer 14 and Vcc wiring layer 13, as illustrated in FIG. 1D. The resistive layer 14 covers an inner surface of the first contact hole 8 therewith, and makes contact with both the gate electrode layer 4 and the semiconductor substrate 1. The Vcc wiring layer 13 is located above the gate electrode layer 4.

After removal of the patterned photoresist 12B, a second interlayer insulating film 16 is deposited over the product.

Then, as illustrated in FIG. 1D, a patterned photoresist 17B is formed over the second interlayer insulating film 16, followed by anisotropic etching of the first and second interlayer insulating films 7 and 16, and the silicon nitride film 5 by using the patterned photoresist 17B as a mask, to thereby form a second contact hole 19B. As illustrated in FIG. 1D, the second contact hole 19B reaches the gate electrode 4.

After removal of the patterned photoresist 17B, another patterned photoresist 17C is formed over the second interlayer insulating film 16. Then, the first and second interlayer insulating films 16 and 7 are partially removed by anisotropic etching with the patterned photoresist 17C used as a mask, to thereby form a third contact hole 18, as illustrated in FIG. 1E. A diffusion layer (not illustrated) formed in the semiconductor substrate 1 is exposed to the thus formed third contact hole 18. The etching for forming the third contact hole 18 is carried out with a selection ratio to the silicon nitride films 5 and 6 being sufficiently great. Hence, even if the third contact hole 18 overlapped the gate electrode 4, a short-circuit can be prevented between the gate electrode layer 4 and a later mentioned contact plug formed in the third contact hole 18, because the gate electrode 4 is entirely covered with the silicon nitride films 5 and 6.

Then, as illustrated in FIG. 1F, after removal of the photoresist 17C, the second contact hole 19B and the third contact hole 18 are filled with tungsten to thereby form tungsten plugs 20 therein. Then, a patterned aluminum wiring layer 21 as a third wiring layer is formed on the second interlayer insulating film 16, making contact with the tungsten plugs 20, as illustrated in FIG. 1F.

In the above-mentioned method of fabricating a semiconductor device, the silicon nitride film 5 is formed on the gate electrode layer 4 for preventing a short-circuit between the contact plug 20 and the gate electrode layer 4, in order to form the contact plug 20 located above the diffusion layer in self-aligned manner against the gate electrode layer 4. Accordingly, the second contact hole 19B reaching the gate electrode layer 4 has to be formed independently of the third contact hole 18 reaching the semiconductor substrate 1 above the diffusion layer. This causes the requisite number of masks to increase, which in turn causes an increase in fabrication costs and a reduction in fabrication yield.

Another semiconductor device layout has been suggested by S. Horiba et al., "A Symmetric Diagonal Driver Transistor SRAM Cell with Imbalance Suppression Technology for Stable Low Voltage Operation", 1996 Symposium on VLSI Technology Digest of Technical Papers, pp. 144–145. There has been suggested a symmetric diagonal driver transistor (SDDT) cell for low voltage SRAM operation which exhibits high alignment tolerance. This symmetric cell layout is said to substantially suppress the imbalance in a pair of cell transistor characteristics.

SUMMARY OF THE INVENTION

In view of the foregoing problems of the conventional methods of fabricating a semiconductor device, it is an object of the present invention to provide a method of fabricating a semiconductor device, which is capable of preventing the number of masks to be used from being increased, and hence enhancing a fabrication yield by making it possible to concurrently form a contact hole reaching a gate electrode and a contact hole reaching a diffusion layer when contact holes are to be formed in self-aligned fashion. It is also an object of the present invention to provide a semiconductor device capable of doing the same.

In one aspect of the present invention, there is provided a method of fabricating a semiconductor device, including the steps of forming a first wiring layer on a semiconductor substrate, the first wiring layer being covered therearound with an insulating film, forming a first interlayer insulating film over the product resulting from the previous step, simultaneously forming a first contact hole reaching the semiconductor substrate and a second contact hole reaching the first wiring layer, forming a second wiring layer over the product resulting from the previous step, forming a second interlayer insulating film over the product resulting from the previous step, simultaneously forming a third contact hole reaching the semiconductor substrate and a fourth contact hole reaching the second wiring layer, and forming a third wiring layer over the third and fourth contact holes.

The first contact hole may reach the first wiring layer as well as the semiconductor substrate. For instance, the second wiring layer may be made of polysilicon or semi-insulating polycrystalline silicon. It is preferable that the third and fourth contact holes are formed by anisotropic etching with a selection ratio to the insulating film being equal to or greater than 10.

It is preferable that the second wiring layer is formed so as to have a first portion, a second portion making contact with both the first wiring layer and the semiconductor substrate, and a third portion making contact with the first wiring layer. In this structure, it is preferable that the second portion has a higher resistance than the first and third portions. To this end, the second portion may be non-doped or implanted at a lower dose than that of the first and third portions. The third portion may be formed so as to have an extended portion on the first interlayer insulating film.

There is further provided a method of fabricating a semiconductor device, including the steps of forming a silicon oxide film on a semiconductor substrate for defining device isolation regions therewith, forming a gate oxide film over the product resulting from the previous step, forming an electrically conductive film over the product resulting from the previous step, forming a first insulating film over the electrically conductive film, etching the first insulating film and the electrically conductive film to thereby form a first wiring layer comprising a plurality of sections, forming a second insulating film around a sidewall of the sections of the first wiring layer, forming a first interlayer insulating film over the product resulting from the previous step, simultaneously forming a first contact hole reaching the semiconductor substrate and a second contact hole reaching the first wiring layer, forming a second wiring layer over the product resulting from the previous step, forming a second interlayer insulating film over the product resulting from the previous step, simultaneously forming a third contact hole reaching the semiconductor substrate and a fourth contact hole reaching the second wiring layer, forming a contact plug in each of the third and fourth contact holes, and forming a third wiring layer on the second interlayer insulating film so as to make contact with the contact plug.

There is still further provided a method of fabricating a semiconductor device, including the steps of forming a silicon oxide film on a semiconductor substrate for defining device isolation regions therewith, forming a gate oxide film over the product resulting from the previous step, forming an electrically conductive film over the product resulting from the previous step, forming a first insulating film over the electrically conductive film, etching the first insulating film and the electrically conductive film to thereby form a first wiring layer comprising a plurality of sections, forming a second insulating film around a sidewall of the sections of the first wiring layer, forming a first interlayer insulating film over the product resulting from the previous step, simultaneously forming a first contact hole reaching the semiconductor substrate and a second contact hole reaching the first wiring layer, forming a second wiring layer over the product resulting from the previous step so that the second wiring layer has an extended portion which extends on the first interlayer insulating film, forming a second interlayer insulating film over the product resulting from the previous step, simultaneously forming a third contact hole reaching the semiconductor substrate and a fourth contact hole reaching the extended portion of the second wiring layer, forming a contact plug in each of the third and fourth contact holes, and forming a third wiring layer on the second interlayer insulating film so as to make contact with the contact plug.

Similarly to the previously mentioned method, the second wiring layer may be formed so as to have a first portion, a second portion making contact with both the first wiring layer and the semiconductor substrate, and a third portion making contact with the first wiring layer so that the second portion has a higher resistance than the first and third portions, in which the extended portion is formed as a part of the third portion.

In another aspect of the present invention, there is provided a semiconductor device including (a) a semiconductor substrate, (b) a first wiring layer formed on the semiconductor substrate and wholly covered with an insulating film, (c) a first interlayer insulating film formed over both the semiconductor substrate and the first wiring layer, the first interlayer insulating film being formed with a first contact hole reaching the semiconductor substrate and a second contact hole reaching the first wiring layer, (d) a second wiring layer formed at least on inner surfaces of the first and second contact holes, and making contact with the first wiring layer at least in the second contact hole, (e) a second interlayer insulating film formed on the first interlayer insulating film, and formed with a third contact hole reaching the semiconductor substrate and a fourth contact hole reaching the first wiring layer, and (f) a third wiring layer formed on the second interlayer insulating film and making electrical connection with the semiconductor substrate through the third contact hole and with the second wiring layer through the fourth contact hole.

There is further provided a semiconductor device including (a) a semiconductor substrate, (b) a first wiring layer formed on the semiconductor substrate and wholly covered with an insulating film, (c) a first interlayer insulating film formed over both the semiconductor substrate and the first wiring layer, the first interlayer insulating film being formed with a first contact hole reaching the semiconductor substrate and a second contact hole reaching the first wiring layer, (d) a second wiring layer formed at least on inner surfaces of the first and second contact holes, and making contact with the first wiring layer at least in the second contact hole, the second wiring layer having an extended portion extending on the first interlayer insulating layer, (e) a second interlayer insulating film formed on the first interlayer insulating film, and formed with a third contact hole reaching the semiconductor substrate and a fourth contact hole reaching the extended portion of the second wiring layer, (f) a third wiring layer formed on the second interlayer insulating film and making electrical connection with the semiconductor substrate through the third contact hole and with the second wiring layer through the fourth contact hole.

In a semiconductor device in accordance with the present invention, the first wiring layer entirely covered with an insulating film is electrically connected to the second wiring layer, which is in turn electrically connected to the third wiring layer. Hence, it is no longer necessary to electrically connect the third wiring layer to the first wiring layer entirely covered with an insulating film. This ensures it possible to electrically connect the third wiring layer to both the semiconductor substrate and the second wiring layer, and accordingly masks to be used for fabricating a semiconductor device is prevented in the number from being increased with the result of enhancement in a fabrication yield.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Hereinbelow is described the present invention in connection with the preferred embodiments in which the present invention is applied to SRAM cell having a resistor as a load element.

[First Embodiment]

FIGS. 2A to 2F illustrates a semiconductor device to be fabricated in accordance with the first embodiment.

Figure 1A:
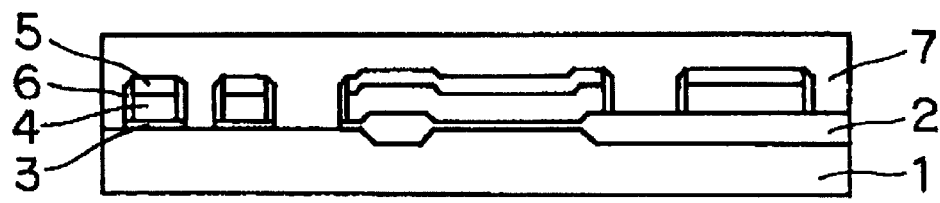
FIGS. 1A to 1F are cross-sectional views of a semiconductor device, illustrating respective steps of a conventional method of fabricating the same.
Figure 1B:
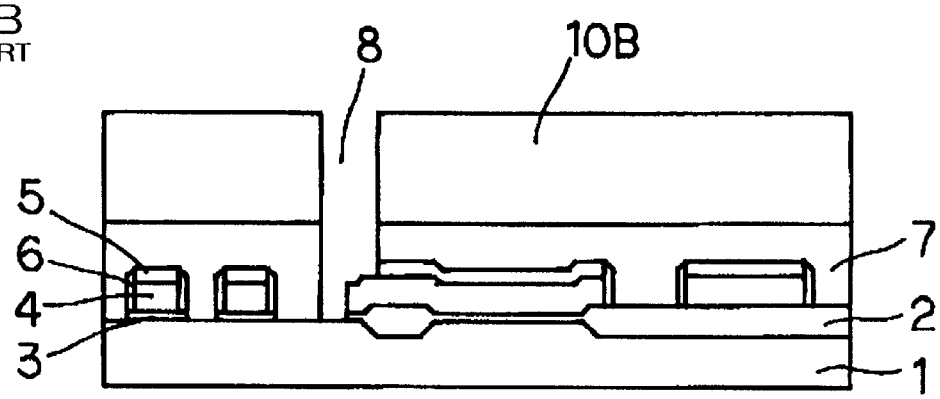
Figure 1C:
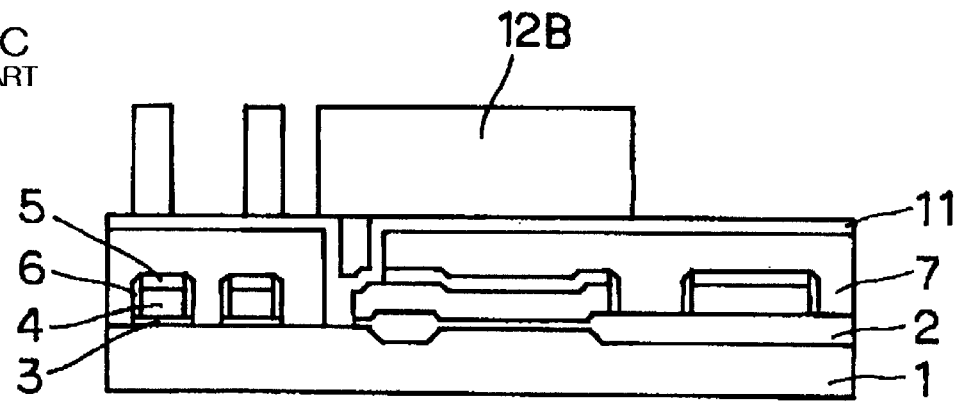
Figure 1D:
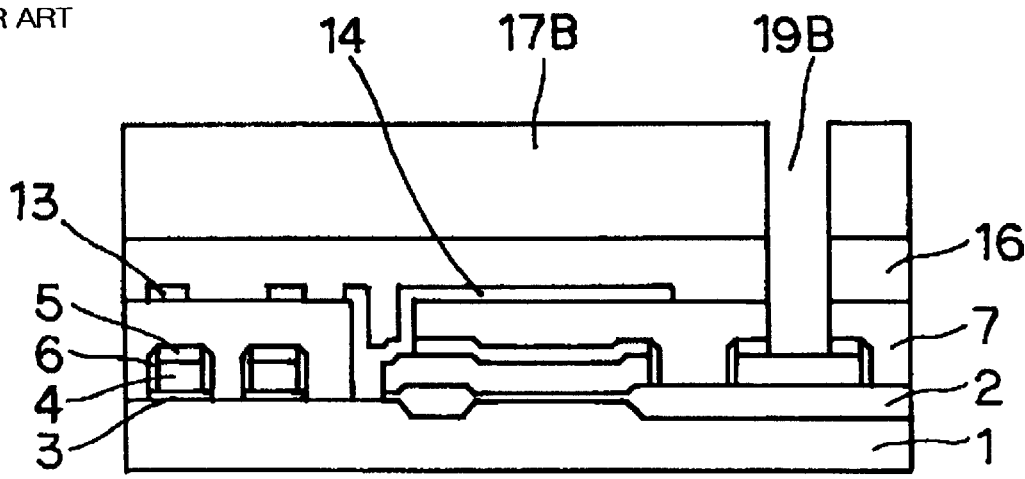
Figure 1E:
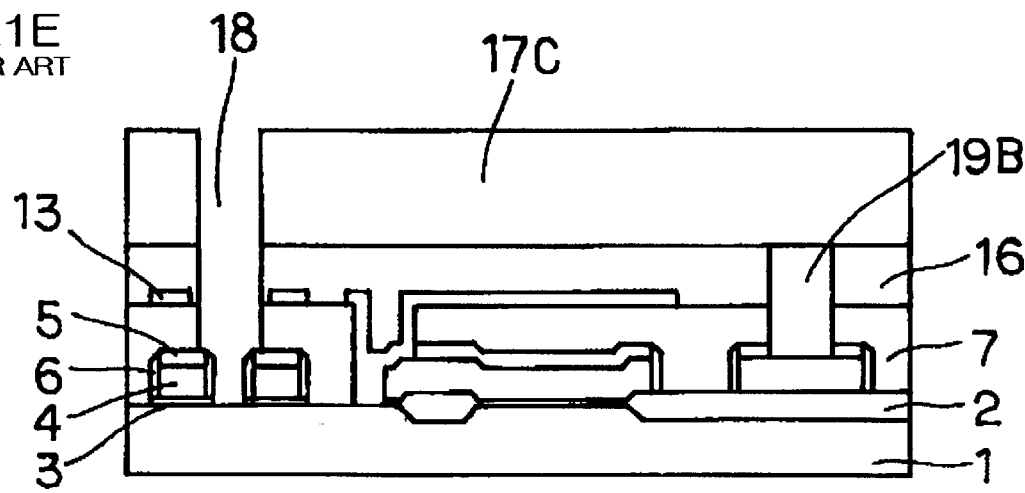
Figure 1F:
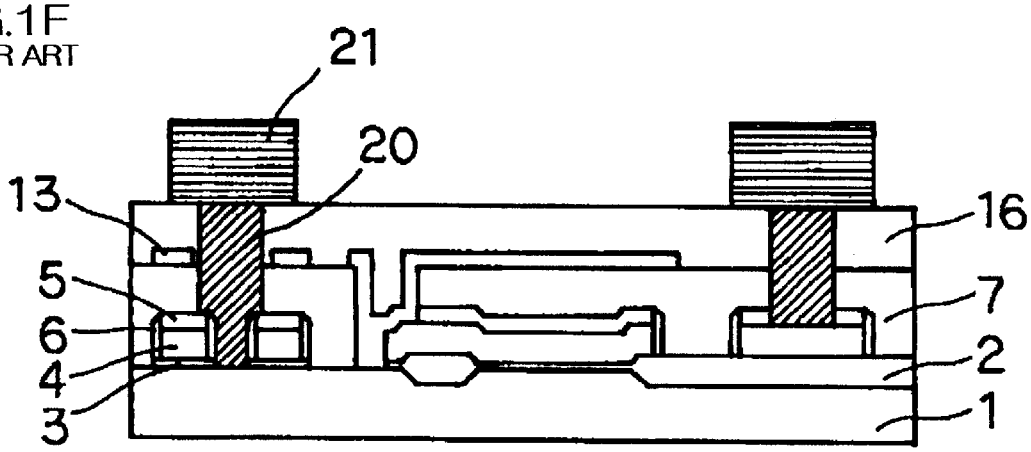
Figure 2A:
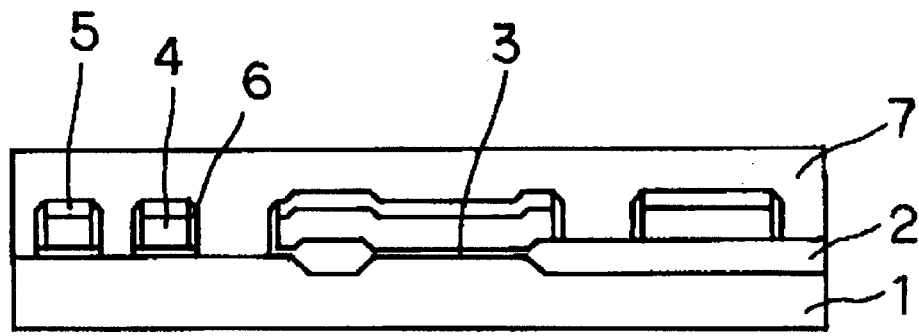
FIGS. 2A to 2F are cross-sectional views of a semiconductor device, illustrating respective steps of a method of fabricating the same in accordance with the first embodiment of the present invention.

As illustrated in FIG. 2A, a thick silicon dioxide film 2 is formed on a semiconductor substrate 1 by a thickness in the range of 200 nm to 500 nm. The silicon dioxide film 2 defines device formation regions surrounded therewith where a semiconductor device is to be formed. Then, a silicon dioxide film which will make a gate oxide film 3 is formed on the semiconductor substrate 1 in the device formation regions by a thickness in the range of 4 nm to 10 nm. Then, a multi-layered structure including a polysilicon film and a refractive silicide film is formed over the product by a total thickness in the range of 50 nm to 300 nm. This multi-layered structure will make a gate electrode or a first wiring layer. Then, a silicon nitride film 5 is deposited over the multi-layered structure by a thickness in the range of 50 nm to 200 nm.

A patterned photoresist (not illustrated) is formed on the silicon nitride film 5, and then, the silicon nitride film 5 is etched with the patterned photoresist used as a mask. Subsequently, the multi-layered structure of the polysilicon film and the refractive silicide film is etched to thereby form a gate electrode 4 as a first wiring layer. After removal of the patterned photoresist, a sidewall 6 made of silicon nitride is formed around both the silicon nitride film 5 and the gate electrode 4. Then, a first interlayer insulating film 7 is deposited entirely over the product. FIG. 2A illustrates the thus formed intermediate product.

Figure 2B:
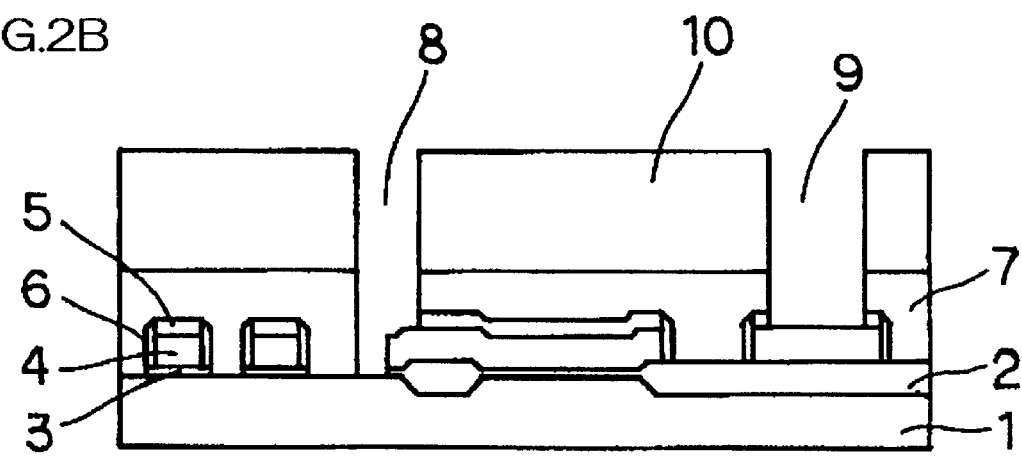

Then, as illustrated in FIG. 2B, a patterned photoresist 10 is formed on the first interlayer insulating film 7, followed by anisotropic etching to thereby concurrently form a shared or first contact hole 8 and a second contact hole 9. The etching for forming the first and second contact holes 8 and 9 is carried out with a selection ratio between the silicon nitride films 5, 6 and the silicon dioxide film being sufficiently small. As a result, the second contact hole 9 reaches the gate electrode 4. The shared or first contact hole 8 reaches both the gate electrode 4 and the semiconductor substrate 1.

Figure 2C:
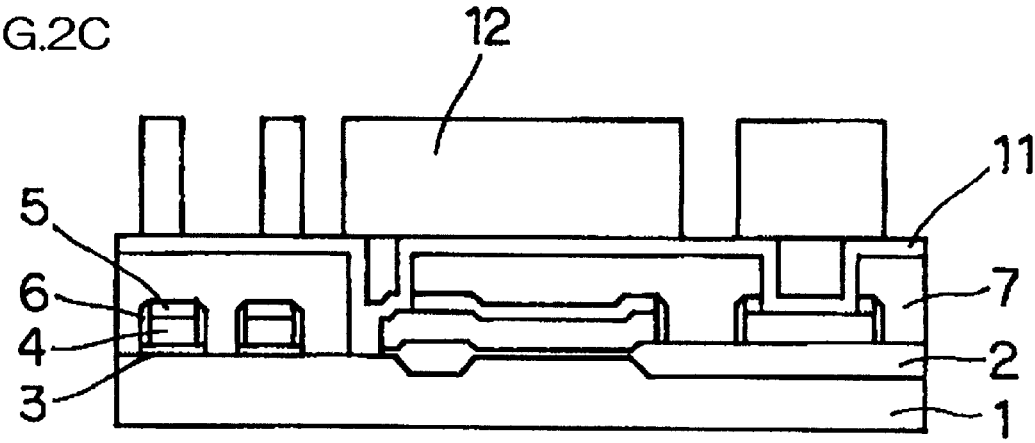

After removal of the photoresist 10, a polysilicon or SIPOS film 11 as a second wiring layer is deposited over the product by a thickness in the range of 20 nm to 100 nm. Then, a patterned photoresist 12 for forming a load layer 14, Vcc wiring layer 13 and a contact pad 15 is formed on the polysilicon or SIPOS film 11, as illustrated in FIG. 2C.

Figure 2D:
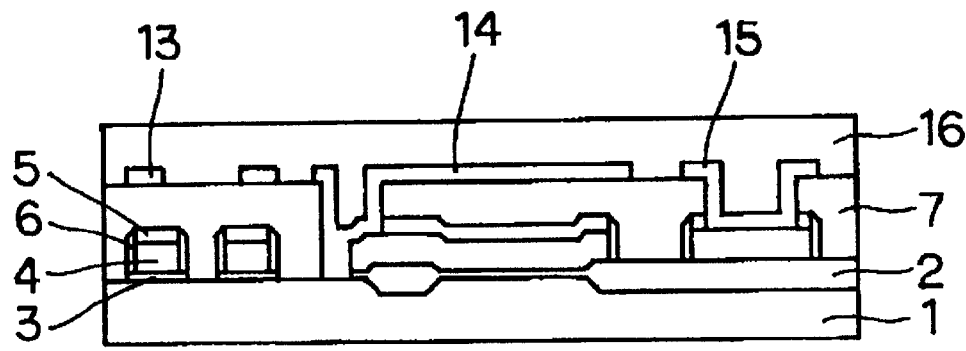

Then, the polysilicon or SIPOS film 11 is anisotropically etched with the patterned photoresist 12 being used as a mask, to thereby form the Vcc wiring layer 13 as a first portion, the load layer 14 as a second portion, and the contact pad 15 as a third portion; as illustrated in FIG. 2D. The load layer 14 covers an inner surface of the first contact hole 8 therewith, and makes contact with both the gate electrode 4 and the semiconductor substrate 1. The Vcc wiring layer 13 is located above the gate electrode 4. The contact pad 15 covers an inner surface of the second contact hole 9 therewith, and makes contact with the gate electrode 4 or the first wiring layer. The load layer 14 is non-doped with impurities, or ion-implanted at a relatively low dose in the range of $1 \times 10^{12}$ cm$^{-2}$ to $1 \times 10^{14}$ cm$^{-2}$ phosphorus, whereas the Vcc wiring layer 13 and the contact pad 15 are ion-implanted at a relatively high dose in the range of $5 \times 10^{14}$ cm$^{-2}$ to $1 \times 10^{16}$ cm$^{-2}$ phosphorus. As a result, the load layer 14 has a higher resistance than that of the Vcc wiring layer 13 and the contact pad 15.

Figure 2E:
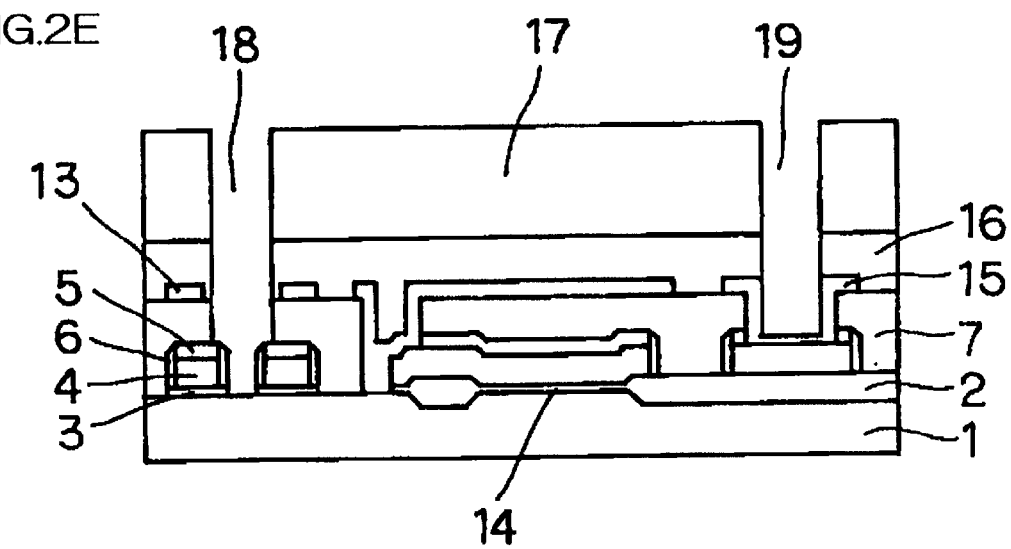

After removal of the patterned photoresist 12, a second interlayer insulating film 16 is deposited over the product, as illustrated in FIG. 2D. Then, a patterned photoresist 17 is formed over the second interlayer insulating film 16, followed by anisotropic etching of the first and second interlayer insulating films 7 and 16 with the patterned photoresist 17 being used as a mask, to thereby form a third contact hole 18 and a fourth contact hole 19. The anisotropic etching is carried out with a selection ratio to the silicon nitride film 5 being equal to or greater than 10. As illustrated in FIG. 2E, the third contact hole 18 reaches the semiconductor substrate 1 above a diffusion layer (not illustrated) formed in the semiconductor substrate 1, and the fourth contact hole 19 reaches the gate electrode 4 or the first wiring layer.

Figure 2F:
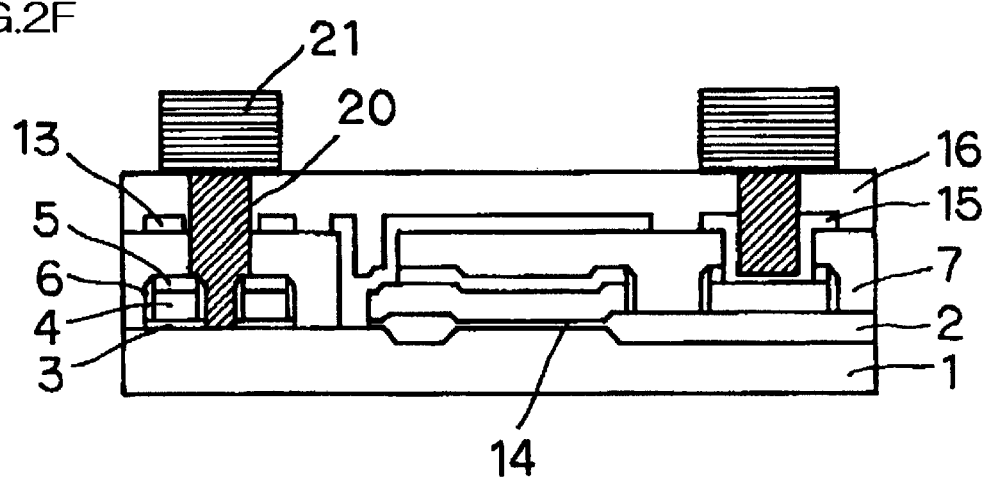

Then, as illustrated in FIG. 2F, after removal of the photoresist 17, the third and fourth contact holes 18 and 19 are filled with tungsten to thereby form tungsten plugs 20 therein. Then, a patterned aluminum wiring layer 21 as a third wiring layer is formed on the second interlayer insulating film 16, making contact with the tungsten plugs 20, as illustrated in FIG. 2F.

In the thus fabricated semiconductor device, when the shared or first contact hole 8 is formed, the second contact hole 9 is concurrently formed so as to reach the gate electrode 4. When the Vcc wiring layer 13 is formed, the contact pad 15 is concurrently formed above the gate electrode 4. In addition, when the third contact hole 18 is formed, the fourth contact hole 19 is concurrently formed above the contact pad 15. Hence, the above-mentioned first embodiment makes it possible to concurrently form a contact hole above a gate electrode and a contact hole above a diffusion layer formed in a semiconductor substrate. This ensures that the number of masks to be used for fabricating a semiconductor device can be reduced by one in comparison with a case where contact holes are formed not concurrently, but separately. As a result, a fabrication yield for fabricating a semiconductor device can be enhanced.

[Second Embodiment]

FIGS. 3A to 3F illustrates a semiconductor device to be fabricated in accordance with the second embodiment.

Figure 3A:
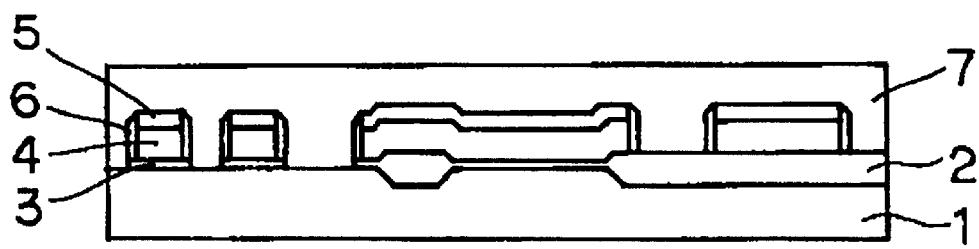
FIGS. 3A to 3F are cross-sectional views of a semiconductor device, illustrating respective steps of a method of fabricating the same in accordance with the second embodiment of the present invention.

As illustrated in FIG. 3A, a thick silicon dioxide film 2 is formed on a semiconductor substrate 1 by a thickness in the range of 200 nm to 500 nm. The silicon dioxide film 2 defines device formation regions surrounded therewith where a semiconductor device is to be formed. Then, a silicon dioxide film which will make a gate oxide film 3 is formed on the semiconductor substrate 1 in the device formation regions by a thickness in the range of 4 nm to 10 nm. Then, a multi-layered structure including a polysilicon film and a refractive silicide film is formed over the product by a total thickness in the range of 50 nm to 300 nm. This multi-layered structure will make a gate electrode or first wiring layer. Then, a silicon nitride film 5 is deposited over the multi-layered structure by a thickness in the range of 50 nm to 200 nm.

A patterned photoresist (not illustrated) is formed on the silicon nitride film 5, and then, the silicon nitride film 5 is etched with the patterned photoresist used as a mask. Subsequently, the multi-layered structure of the polysilicon film and the refractive silicide film is etched to thereby form a gate electrode 4 as a first wiring layer. After removal of the patterned photoresist, a sidewall 6 made of silicon nitride is formed around both the silicon nitride film 5 and the gate electrode 4. Then, a first interlayer insulating film 7 is deposited entirely over the product.

Figure 3B:
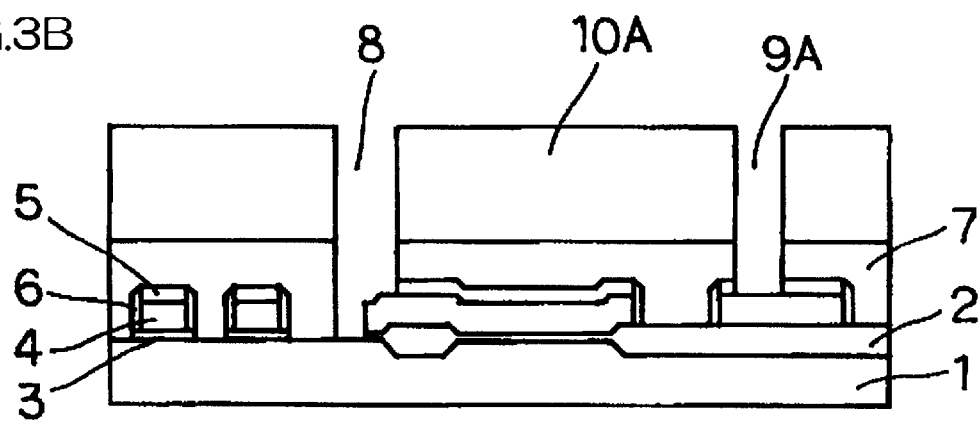

Then, as illustrated in FIG. 3B, a patterned photoresist 10A is formed on the first interlayer insulating film 7, followed by anisotropic etching to thereby concurrently form a shared or first contact hole 8 and a second contact hole 9A. The etching for forming the first and second contact holes 8 and 9A is carried out with a selection ratio between the silicon nitride films 5, 6 and the silicon dioxide film being sufficiently small. As a result, the second contact hole 9A reaches the gate electrode 4. The shared or first contact hole 8 reaches both the gate electrode 4 and the semiconductor substrate 1.

Figure 3C:
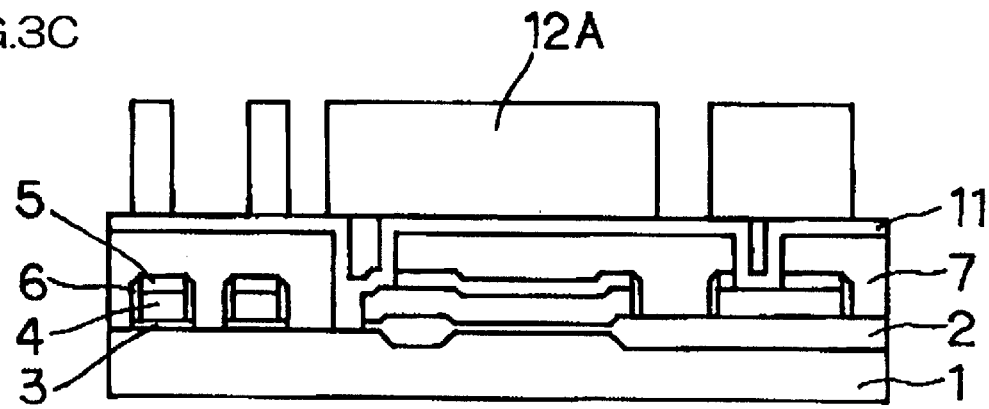

After removal of the photoresist 10A, a polysilicon or SIPOS film 11 as a second wiring layer is deposited over the product by a thickness in the range of 20 nm to 100 nm. Then, a patterned photoresist 12A for forming a load layer 14, Vcc wiring layer 13 and a contact pad 15A is formed on the polysilicon or SIPOS film 11, as illustrated in FIG. 3C.

Figure 3D:
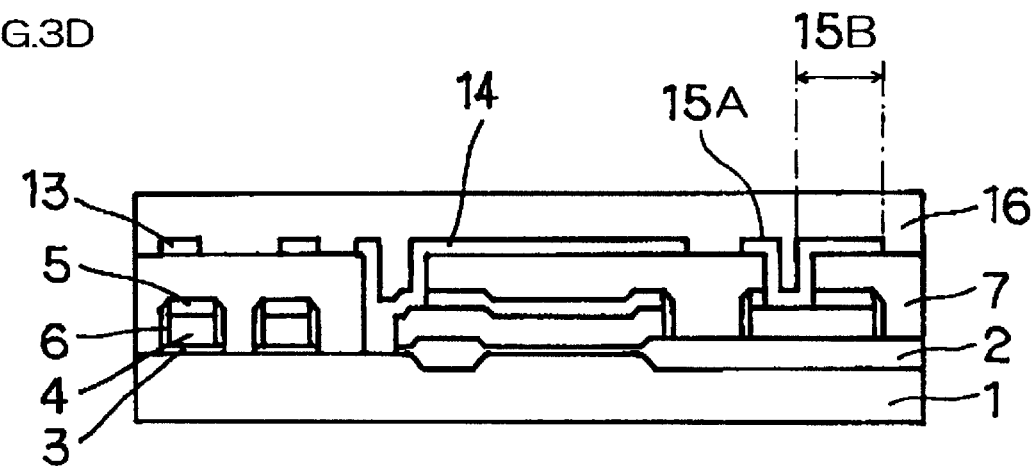

Then, the polysilicon or SIPOS film 11 is anisotropically etched with the patterned photoresist 12A being used as a mask, to thereby form the Vcc wiring layer 13 as a first portion, the load layer 14 as a second portion, and the contact pad 15A as a third portion, as illustrated in FIG. 3D. The load layer 14 covers an inner surface of the first contact hole 8 therewith, and makes contact with both the gate electrode 4 and the semiconductor substrate 1. The Vcc wiring layer 13 is located above the gate electrode 4. The contact pad 15A covers an inner surface of the second contact-hole 9A therewith, and makes contact with the gate electrode 4 or the first wiring layer. In addition, the contact pad 15A is formed with an extended portion 15B extending on the first interlayer insulating layer 7. The load layer 14 is non-doped with impurities, or ion-implanted at a relatively low dose in the range of $1 \times 10^{12}$ cm$^{-2}$ to $1 \times 10^{14}$ cm$^{-2}$ phosphorus; whereas the Vcc wiring layer 13 and the contact pad 15 are ion-implanted at a relatively high dose in the range of $5 \times 10^{14}$ cm$^{-2}$ to $1 \times 10^{16}$ cm$^{-2}$ phophorus. As a result, the load layer 14 has a higher resistance than that of the Vcc wiring layer 13 and the contact pad 15A.

Figure 3E:
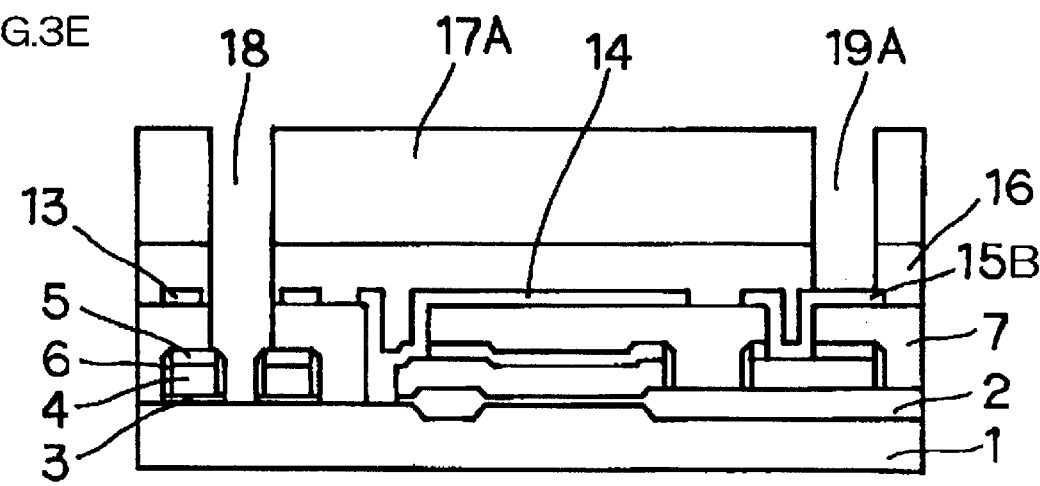

After removal of the patterned photoresist 12A, a second interlayer insulating film 16 is deposited over the product, as illustrated in FIG. 3D. Then, a patterned photoresist 17A is formed over the second interlayer insulating film 16, followed by anisotropic etching of the first and second interlayer insulating films 7 and 16 with the patterned photoresist 17A being used as a mask, to thereby form a third contact hole 18 and a fourth contact hole 19A. The anisotropic etching is carried out with a selection ratio to the silicon nitride film 5 being equal to or greater than 10. As illustrated in FIG. 3E, the third contact hole 18 reaches the semiconductor substrate 1 above a diffusion layer (not illustrated) formed in the semiconductor substrate 1, and the fourth contact hole 19A reaches the extended portion 15B of the contact pad 15A.

Figure 3F:
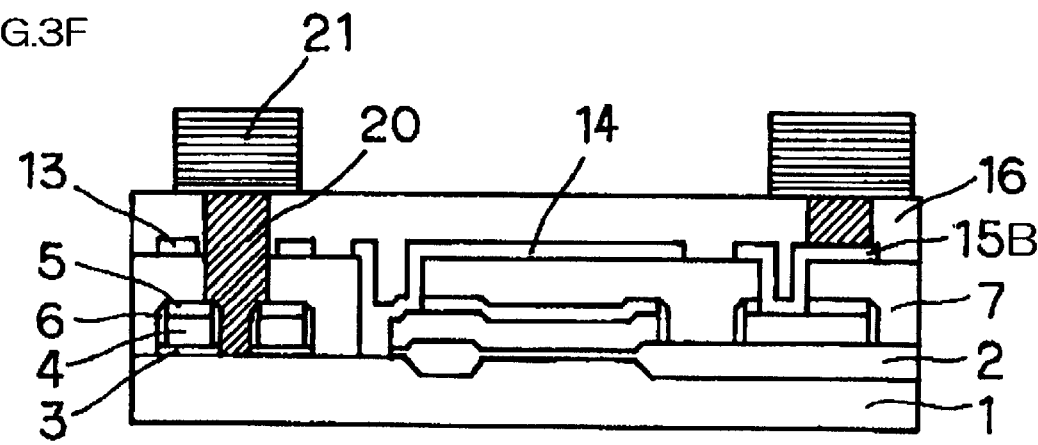

Then, as illustrated in FIG. 3F, after removal of the photoresist 17A, the third and fourth contact holes 18 and 19A are filled with tungsten to thereby form tungsten plugs 20 therein. Then, a patterned aluminum wiring layer 21 as a third wiring layer is formed on the second interlayer insulating film 16, making contact with the tungsten plugs 20, as illustrated in FIG. 3F. The aluminum wiring layer 21 makes electrical contact with the gate electrode 4 through the contact plug 20 and the extended portion 15B of the contact pad 15A.

The above-mentioned second embodiment makes it possible to reduce the number of masks to be used for fabricating a semiconductor device by one in comparison with a case where contact holes are formed not concurrently, but separately, similarly to the first embodiment. In addition, since the contact pad 15A is formed with the extended portion 15B, it is possible to vary where the fourth contact hole 19A is formed, within a length of the extended portion 15B. This ensures enhanced designability in designing a semiconductor device.

As having been explained in connection with the preferred embodiments, the present invention provides two major advantages. One of them is that the reduction in the number of masks is ensured with the result of reduction in fabrication costs and enhancement in a fabrication yield. This is because a contact hole above a gate electrode is formed concurrently with a contact hole above a diffusion layer. The other is that the greater designability in forming a contact hole above a gate electrode is ensured by virtue of an extended portion of a contact pad which is formed concurrently with Vcc wiring layer.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-60752 filed on Mar. 14, 1997 including specification, claims, drawings and summary is incorporated herein by reference in its entirety.

What is claimed is:

1. A method of fabricating a semiconductor device, comprising the steps of:

(a) forming a first wiring layer having a thickness between 50 nm and 300 nm on a semiconductor substrate, said first wiring layer being covered therearound with an insulating film including a sidewall film at least partially comprised of silicon nitride;

(b) forming a first interlayer insulating film over the product resulting from said step (a);

(c) simultaneously forming a first contact hole reaching said semiconductor substrate and a second contact hole reaching said first wiring layer;

(d) forming a second wiring layer having a thickness between 20 nm and 100 nm disposed upon the product resulting from said step (c), said second wiring layer including a load element, a Vcc element, and a contact pad element, wherein said load element is non-doped with impurities or doped with impurities in a range of $1 \times 10^{12}$ cm$^{-2}$–$1 \times 10^{14}$ cm$^{-2}$ and wherein said Vcc element and said contact pad element are doped with impurities in a range of $5 \times 10^{14}$ cm$^{-2}$–$1 \times 10^{16}$ cm$^{-2}$;

(e) forming a second interlayer insulating film over the product resulting from said step (d);

(f) forming a patterned photoresist layer upon said second interlayer insulating film and simultaneously forming a third contact hole reaching said semiconductor substrate and a fourth contact hole reaching said second wiring layer; and (g) forming a third wiring layer over said third and fourth contact holes.

2. The method as set forth in claim 1, wherein said second wiring layer is made of polysilicon.

3. The method as set forth in claim 1, wherein said second wiring layer is made of semi-insulating polycrystalline silicon.

4. The method as set forth in claim 1, wherein said third and fourth contact holes are formed by anisotropic etching with a selection ratio to said insulating film being equal to or greater than 10, with said insulating film being used as an etching stopper.

5. The method as set forth in claim 1, wherein said second wiring layer is formed in said step (d) so as to have a first portion, a second portion making contact with both said first wiring layer and said semiconductor substrate, and a third portion making contact with said first wiring layer so that said second portion has a higher resistance than said first and third portions.

6. The method as set forth in claim 5, wherein said second portion is non-doped or implanted at a lower dose than that of said first and third portions.

7. The method as set forth in claim 5, wherein said third portion is formed so as to have an extended portion on said first interlayer insulating film.

8. The method as set forth in claim 1, wherein said first contact hole reaches said first wiring layer as well as said semiconductor substrate.

9. A method of fabricating a semiconductor device, comprising the steps of:

(a) forming a silicon oxide film on a semiconductor substrate for defining device isolation regions therewith;

(b) forming a gate oxide film over the product resulting from said step (a);

(c) forming an electrically conductive film having a thickness between 50 nm and 300 nm over the product resulting from said step (b);

(d) forming a first insulating film over said electrically conductive film;

(e) etching said first insulating film and said electrically conductive film to thereby form a first wiring layer comprising a plurality of sections;

(f) forming a second insulating film at least partially comprised of silicon nitride around a sidewall of said sections of said first wiring layer;

(g) forming a first interlayer insulating film over the product resulting from said step (f);

(h) simultaneously forming a first contact hole reaching said semiconductor substrate and a second contact hole reaching said first wiring layer;

(i) forming a second wiring layer having a thickness between 20 nm and 100 nm over the product resulting from said step (h), said second wiring layer including a load element, a Vcc element, and a contact pad element, wherein said load element is non-doped with impurities or doped with impurities in a range of $1 \times 10^{12}$ cm$^{-2}$–$1 \times 10^{14}$ cm$^{-2}$ and wherein said Vcc element and said contact pad element are doped with impurities in a range of $5 \times 10^{14}$ cm$^{-2}$–$1 \times 10^{16}$ cm$^{-2}$;

(j) forming a second interlayer insulating film over the product resulting from said step (h);

(k) forming a patterned photoresist layer upon said second interlayer insulating film and simultaneously forming a third contact hole reaching said semiconductor substrate and a fourth contact hole reaching said second wiring layer;

(l) forming a contact plug in each of said third and fourth contact holes; and (m) forming a third wiring layer on said second interlayer insulating film so as to make contact with said contact plug.

10. The method as set forth in claim 9, wherein said second wiring layer is made of polysilicon.

11. The method as set forth in claim 9, wherein said second wiring layer is made of semi-insulating polycrystalline silicon.

12. The method as set forth in claim 9, wherein said third and fourth contact holes are formed by anisotropic etching with a selection ratio to said insulating film being equal to or greater than 10, with said insulating film being used as an etching stopper.

13. The method as set forth in claim 9, wherein said second wiring layer is formed in said step (i) so as to have a first portion, a second portion making contact with both said first wiring layer and said semiconductor substrate, and a third portion making contact with said first wiring layer so that said second portion has a higher resistance than said first and third portions.

14. The method as set forth in claim 13, wherein said second portion is non-doped or implanted at a lower dose than that of said first and third portions.

15. The method as set forth in claim 9, wherein said first contact hole reaches said first wiring layer as well as said semiconductor substrate.

16. A method of fabricating a semiconductor device, comprising the step of:

(a) forming a silicon oxide film on a semiconductor substrate for defining device isolation regions therewith;

(b) forming a gate oxide film over the product resulting from said step (a);

(c) forming an electrically conductive film having a thickness between 50 nm and 300 nm over the product resulting from said step (b);

(d) forming a first insulating film over said electrically conductive film;

(e) etching said first insulating film and said electrically conductive film to thereby form a first wiring layer comprising a plurality of sections;

(f) forming a second insulating film at least partially comprised of silicon nitride around a sidewall of said sections of said first wiring layer;

(g) forming a first interlayer insulating film over the product resulting from said step (f);

(h) simultaneously forming a first contact hole reaching said semiconductor substrate and second contact hole reaching said first wiring layer;

(i) forming a second wiring layer having a thickness between 20 nm and 100 nm over the product resulting from said step (h) so that said second wiring layer has an extended portion which extends on said first interlayer insulating film, said second wiring layer including a load element, a Vcc element, and a contact pad element, wherein said load element is non-doped with impurities or doped with impurities in a range of $1\times10^{12}$ cm$^{-2}$–$1\times10^{14}$ cm$^{-2}$ and wherein said Vcc element and said contact pad element are doped with impurities in a range of $5\times10^{14}$ cm$^{-2}$–$1\times10^{16}$ cm$^{-2}$;

(j) forming a second interlayer insulating film over the product resulting from said step (i);

(k) forming a patterned photoresist layer upon said second interlay insulating film and simultaneously forming a third contact hole reaching said semiconductor substrate and a fourth contact hole reaching said extended portion of said second wiring layer;

(l) forming a contact plug in each of said third and fourth contact holes; and (m) forming a third wiring layer on said second interlayer insulating film so as to make contact with said contact plug.

17. The method as set forth in claim 16, wherein said second wiring layer is made of polysilicon.

18. The method as set forth in claim 16, wherein said second wiring layer is made of semi-insulating polycrystalline silicon.

19. The method as set forth in claim 16, wherein said third and fourth contact holes are formed by anisotropic etching with a selection ratio to said insulating film being equal to or greater than 10, with said insulating film being used as an etching stopper.

20. The method as set forth in claim 16, wherein said second wiring layer is formed in said step (i) so as to have a first portion, a second portion making contact with both said first wiring layer and said semiconductor substrate, and a third portion making contact with said first wiring layer so that said second portion has a higher resistance than said first and third portions, said extended portion being a part of said third portion.

21. The method as set forth in claim 20, wherein said second portion is non-doped or implanted at a lower dose than that of said first and third portions.

22. The method as set forth in claim 16, wherein said first contact hole reaches said first wiring layer as well as said semiconductor substrate.

* * * * *